(12) United States Patent
Yokomizo et al.

(10) Patent No.: US 6,399,517 B2
(45) Date of Patent: *Jun. 4, 2002

(54) ETCHING METHOD AND ETCHING APPARATUS

(75) Inventors: Kenji Yokomizo, Dr Round Rock; Tom Williams, Dr Austin, both of TX (US)

(73) Assignee: Tokyo Electron Limited, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/281,689

(22) Filed: Mar. 30, 1999

(51) Int. Cl.$^7$ ............................................. H01L 21/302
(52) U.S. Cl. ...................... 438/745; 438/747; 438/749; 438/750; 438/753
(58) Field of Search ................................ 438/745, 747, 438/749, 750, 753

(56) References Cited

U.S. PATENT DOCUMENTS 4,871,417 A * 10/1989 Nishizawa et al. ......... 156/640
5,332,445 A * 7/1994 Bergman ....................... 134/3
5,820,689 A * 10/1998 Tseng et al. ................... 134/3

FOREIGN PATENT DOCUMENTS

| JP | 2-096334 | * 4/1990 | ......... H01L/21/306 |
| JP | 9-064005 | * 3/1997 | ......... H01L/21/304 |

* cited by examiner

Primary Examiner—Benjamin L. Utech
Assistant Examiner—Charlotte A. Brown
(74) Attorney, Agent, or Firm—Morrison & Foerster

(57) ABSTRACT

An etching method and an etching apparatus are provided. Silicon (Si) from surfaces semiconductor wafers W dissolves into an etching liquid E stored in a process bath 10. On detection of the concentration of silicon by a concentration sensor 50, the etching liquid E in the process bath 10 is discharged while leaving a part of the etching liquid when the Si concentration in the etching liquid E reaches a designated concentration. After that, a new etching liquid of substantially equal to an amount of the discharged etching liquid E is supplied into the process bath 10 and added to the etching liquid remaining in the bath 10. Consequently, it is possible to restrict the etching rate just after the exchange of etching liquid from rising excessively.

15 Claims, 7 Drawing Sheets

ETCHING METHOD AND ETCHING APPARATUS

BACKGROUND OF THE INVENTION

1. Technical Field of the Invention

The present invention relates to a wet etching method and a wet etching apparatus. More particularly, it relates to a technique to control characteristics of an etching liquid used in wet etching of objects to be processed, such as semiconductor wafers.

2. Description of the Related Art

FIGS. 9A and 9B are views for explanation of an etching process for the semiconductor wafers. FIG. 9A shows a wafer W before etching. On a surface of a silicon substrate 1 as base metal, a silicon oxide layer 2 ($SiO_2$) and a silicon nitride layer 3 ($Si_4N_3$) are laminated as undercoating layers, in sequence. On the surface of the silicon nitride layer 3, a resist film 4 is applied in the form of a designated pattern. (see FIG. 9A) The wafer W is immersed into a phosphate solution ($H_3PO_4$ aq.) of 160 to 180° C. in a not-shown process bath and etched as shown in FIG. 9B. In the etching process, it is important to control a layer thickness of the silicon oxide layer 2 underlying the silicon nitride layer 3.

Japanese Examined Patent Publication (kokoku) No. 3-20895 discloses an example of the wet etching apparatus. In the apparatus, the etching liquid is stored in the process bath and heated up to 160 to 180° C. in temperature. Connected to the process bath is a circulating pipe which includes a circulation pump, a filter, a temperature controller, etc. The etching liquid is controlled at a predetermined temperature by its circulation through the circulating pipe.

When repeating the etching process, it causes the concentration of silicon (Si) in the phosphate solution to be increased to produce oxides and particles. Consequently, the filters interposed in the circulating pipe are choked by the above substances. Thus, in the etching process, the etching liquid in the process bath has been exchanged in its entirety at regular intervals.

However, it should be noted that the etching rate against the oxide layer is extremely high immediately after the etching liquid, i.e. the phosphate solution ($H_3PO_4$ aq.) has been exchanged for new one. Thus, as shown in FIG. 10, the silicon oxide layer 2 underlying the silicon nitride layer 3 is excessively etched (over-etching) to produce a recess 5, whereby it is difficult to control the thickness of oxide layer.

In order to solve the above problem, it has been studied to shorten a processing period after exchanging the etching liquid or control the etching rate against the oxide layer, for example, by immersing a dummy wafer made of silicon into the etching liquid in view of elevating the concentration of silicon intentionally. In the former method of shortening the processing period, however, it is impossible to fully control the layer thickness of oxide layer because of the difficulty in managing the processing period. While, in the latter method of raising the concentration of silicon intentionally, the wafers have been wasted from the exchange of the etching liquid till the etching capable of the desired layer thickness, so that the yield of products falls.

Again, as the etching liquid is to be used at high temperature of 160 to 180° C., there is also a problem raised of wasting much time in order to elevate the temperature of the etching liquid after it has been exchanged. Additionally, the problem is accompanied by high consumption of the etching liquid.

SUMMARY OF THE INVENTION

Accordingly, it is therefore an object of the present invention to provide a method of and an apparatus for etching, which is capable of simplifying the etching control and improving the yield of products and by which it is possible to make use of the etching liquid effectively and shorten a period required for exchanging the same. In order to attain the above object, according to the first aspect of the present invention, there is provided an etching method including the steps of: etching an object to be processed by immersing the object in an etching liquid stored in a process bath; draining a predetermined amount of the etching liquid used in the etching step from the process bath while leaving the remaining amount of the etching liquid; and supplying a new etching liquid into the process bath to add the new etching liquid to the remaining etching liquid.

According to the present invention, since the predetermined amount of etching liquid used for the etching step is discharged while leaving a part of the liquid in the process bath and the new etching liquid is supplied into the process bath, it is possible to shorten the time required for discharging and charging the etching liquid. Thus, with the reduction in the exchange period of the etching liquid, it is possible to use the etching liquid effectively.

Additionally, since the object to be processed is not subjected to over-etching just after exchanging the etching liquid, it is possible to control a layer thickness of the object with ease, whereby the yield of products can be improved. Moreover, since the new etching liquid is added to the etching liquid of high temperature which is remaining after discharging the etching liquid of the predetermined amount, it is possible to shorten a period required for elevating the temperature of the etching up to a predetermined temperature capable of effective etching, whereby the reduction in energy consumption can be accomplished.

According to the second aspect of the present invention, there is also provided an etching apparatus including: a process bath for accommodating an object to be processed therein and storing an etching liquid for etching the object; a drain system for draining the etching liquid in the process bath, the drain system being capable of adopting a draining state in which the drain system is draining the etching liquid and a non-draining state in which the drain system stops draining the etching liquid; a supply system for supplying a new etching liquid into the process bath, the supply system being capable of adopting a supplying state in which the supply system is supplying the etching liquid and a non-supplying state in which the drain system stops supplying the new etching liquid; and control means for controlling an operation of the drain system to drain a predetermined amount of the etching liquid in the process bath while leaving the remaining amount of the etching liquid and an operation of the supply system to supply the new etching liquid into the process bath, when the concentration of a specified substance contained in the etching liquid in the process bath reaches a predetermined value.

The above and other features and advantages of the present invention will become apparent and the invention itself will best be understood with reference to the attached drawings showing a preferred embodiment of the invention.

DESCRIPTION OF THE PREFERRED EMBODIMENT

An embodiment of the present invention will be described with reference to drawings. Note, in the below-mentioned embodiment, the etching apparatus of the invention is applied in order to etch semiconductor wafers having a silicon oxide layer and a silicon nitride layer both laminated on a silicon substrate, by turns.

Figure 1:
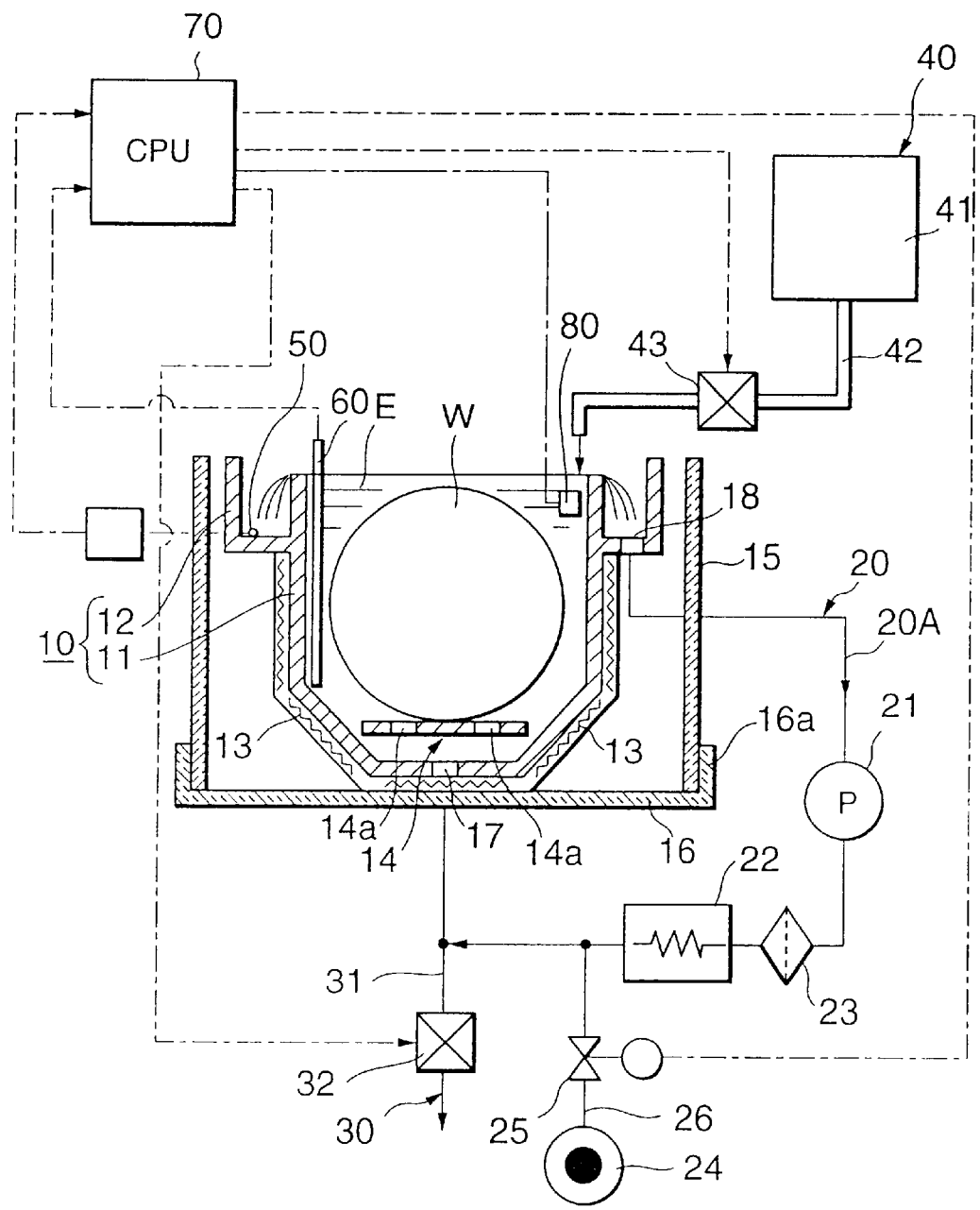
FIG. 1 is a schematic cross sectional view of an etching apparatus in accordance with one embodiment of the present invention.
Figure 2:
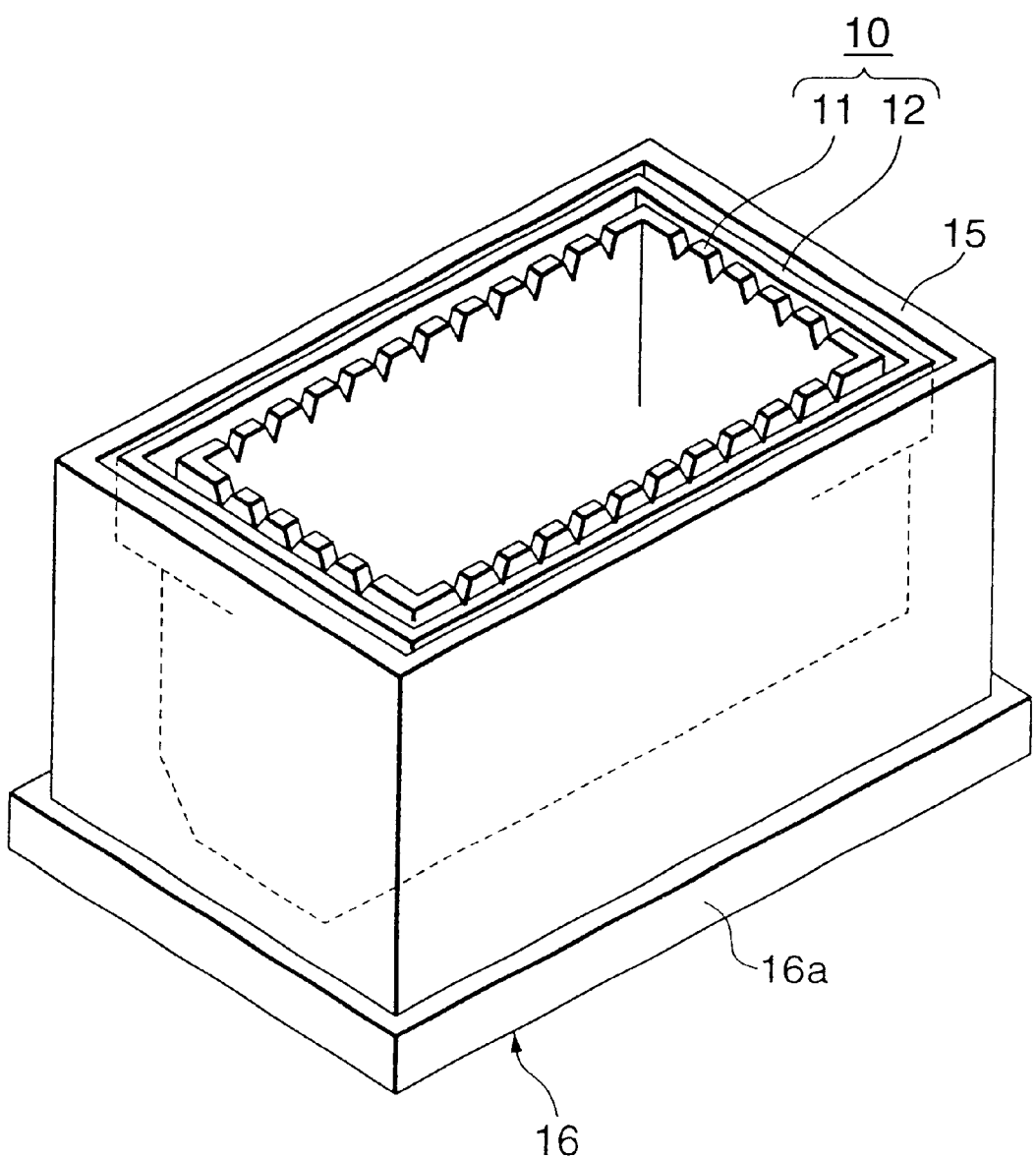
FIG. 2 is a perspective view showing a process bath arranged in the etching apparatus of FIG. 1.

As shown in FIGS. 1 and 2, the etching apparatus includes:

- a process bath 10 accommodating the semiconductor wafers W (referred as "wafers W", hereinafter) as objects being processed and also storing an etching liquid E, for example the phosphate solution ($H_3PO_4$ aq.) in this embodiment;
- a circulation system 20 which treats the etching liquid E overflowing the process bath 10 and subsequently returns the liquid to the process bath 10 again;
- a drain system 30 draining the etching liquid E from the process bath 10; and
- a supply system 40 supplying a new etching liquid E into the process bath 10.

The process bath 10 includes an inner bath 11 made of quartz to store the etching liquid E and an outer bath 12 also made of quartz to receive the etching liquid E overflowing the inner bath 11. While the etching process is carried out, the wafers W are accommodated in the inner bath 11 while they are carried by a not-shown wafer boat vertically.

The inner bath 11 is provided, on outer surfaces of bottom and lateral portions thereof, with a panel heater 13. On the bottom side of the interior of the inner bath 11, a rectifying plate 14 is provided with a plurality of elongated holes 14a parallel to each other. The rectifying plate 14 does guide the etching liquid E, which has been supplied into the inner bath 11 of the process bath 10 through the circulation system 20, from the underside of the plate 14 toward the wafers W thereabove, uniformly.

Around the process bath 10, there is standing a thermal insulating wall 15 which is made of heat insulating material, for example polytetra-fluoroethylene (PTFE). The thermal insulating wall 15 is provided to prevent both radiating of heat to a sink area where the process bath 10 is disposed, and lowering of temperature of the etching liquid E in the bath 10. The thermal insulating wall 15 is positioned by attachment rims 16a standing on four sides of a frame plate 16. The frame plate 16 is also made of heat insulating material, for example polytetra-fluoroethylene (PTFE).

The circulation system 20 comprises a circulation pipe line 20A. The circulation pipe line 20A has one end connected to a supply port 17 formed in the bottom of the inner bath 11 and the other end connected to a drain port 18. Note, the supply port 17 is also used as a drain port of the drain system 30 described later.

In the circulation pipe line 20A, there are provided a circulation pump 21, a filter 23 and a temperature controller 22 having a heater in order from the side of the drain port 18 toward the side of the supply port 17. On the downstream side of the temperature controller 22, a pure water source 24 which supplies a dilution (e.g. pure water) for controlling the concentration of the etching liquid E is connected to the circulation pipe line 20A through a pure water pipe line 26. A valve 25 capable of the adjustment of the flow rate is interposed in the pure water pipe line 26.

On the side of the supply port 17 of the circulation pipe line 20A, a drain pipe line 31 is connected to the pipe line 20A, in order to discharge the etching liquid E in the inner bath 11 of the process bath 10. That is, the drain pipe line 31 and a part of the circulation pipe line 20A both constitute the pipe line of the drain system 30. An opening/closing valve 32 is interposed in the drain pipe line 31. The opening of the valve 32 allows the etching liquid E in the inner bath 11 to be discharged out of the bath 10.

It is noted that, in the embodiment shown in FIG. 1, the circulation pipe line 20A partially constitutes the drain pipe line. Alternatively, an exclusive drain pipe without sharing with the circulation pipe line 20A may be directly connected to the bottom of the inner bath 11 in another embodiment.

The supply system 40 comprises an etching liquid reservoir 41 as a source to supply a new etching liquid and a supply pipe line 42 for supplying the new etching liquid to the inner bath 11 of the process bath 10. The etching liquid reservoir 41 is disposed at a position higher than that of the process bath 10. An end of the supply pipe line 42 is connected to the etching liquid reservoir 41, while the other end of the line 42 is positioned above an opening of the inner bath 11 of the process bath 10. An opening/closing valve 43 is interposed in the supply pipe line 42. The opening of the valve 43 allows the new etching liquid E stored in the reservoir 41 to falling into the inner bath 11.

In the outer bath 12 of the process bath 10, a concentration sensor (concentration detecting means) 50 is provided for detecting the concentration of a substance dissolving from the surfaces of the wafers W into the etching liquid E stored in the process bath 10. A detection signal generated from the concentration sensor 50 is transmitted to control means, for example a central processing unit (CPU) 70. In the CPU 70, the concentration data obtained by the concentration sensor 50 is compared with a pre-stored concentration of reference. Based on the comparison, the CPU 70 outputs control signals to control respective operations of the valve 32 in the drain system 30, the valve 43 in the supply system 40.

Additionally, in the inner bath 11 of the process bath 10, a level sensor (liquid level detecting means) 60 is provided for detecting the level of a surface of the etching liquid E stored in the process bath 10. A detection signal generated from the level sensor 60 is also transmitted to the CPU 70. In the CPU 70, the level data obtained by the level sensor 60 is compared with a pre-stored level of reference. Based on the comparison, the CPU 70 outputs control signals to control respective operations of the valve 32 in the drain system 30 and the valve 43 in the supply system 40.

Furthermore, a temperature sensor (temperature detecting means) 80 is provided in the inner bath 11 for sensing a temperature of the etching liquid E in the inner bath. A detecting signal generated from the temperature sensor 80 is also transmitted to the CPU 70. The CPU 70 outputs control signals to control an operation of the valve 25 in the pure water pipe line 26.

Note, in another embodiment, the level sensor 60 may be eliminated. That is, on the assumption that the displacement of etching liquid per unit time due to the drain system 30 and the charging amount of new etching liquid due to the supply system 20 are both known, the CPU 70 may be equipped with a function of "timer". In this case, the CPU 70 would control the operations of the valves 32, 43 so that the valve 32 is closed after a predetermined period has passed since the opening of the valve 32 in the drain system 30 and that, thereafter, the valve 43 is closed after a predetermined period has passed since the opening of the valve 43 in the supply system 40.

Next, we describe a method of etching the wafers W by use of the above-mentioned etching apparatus. First of all, it is carried out to supply the etching liquid E, e.g. phosphate solution ($H_3PO_4$aq.) into the inner bath 11 of the process bath 10 until the liquid E overflows into the outer bath 12. Next, the circulation pump 21 is operated so as to cause the etching liquid E overflowing into the outer bath 12 to return to the inner bath 11 through the circulation pipe line 20A. Next, by using the panel heater 13 and the temperature controller 22 in the circulation system 20, the etching liquid E is heated until boils in the bath 11.

After the temperature of the etching liquid E rises into the boiling state, the quantity of heat applied on the etching liquid E in the circulation pipe line 20A is controlled by the temperature controller 22, so that the etching liquid E in the inner bath 11 is maintained at a predetermined temperature to keep the boiling state.

Note, in order to carry out the etching operation at a desired etching rate, it is necessary to maintain the etching liquid E of the appointed concentration and also maintain the temperature of the etching liquid E at a boiling point peculiar to the etching liquid E of the appointed concentration. From this point of view, since the panel heater 13 heats the inner bath 11 in order to prevent the temperature of the etching liquid E in the inner bath 11 from dropping, the heater 13 performs an auxiliary part in maintaining the temperature of the etching liquid E in the inner bath 11 at the above boiling point.

In this state, the wafers W vertically carried by the wafer boat (not shown) are accommodated in the inner bath 11 of the process bath 10. Then, the wafers W are immersed into the etching liquid E in the inner bath 11 for a predetermined period for etching. Subsequently, the wafers W are picked up from the process bath 10.

Throughout the etching process (while the wafers W are being immersed in the etching liquid E in the inner bath 11) and in the interval between the etching processes (while the wafers W are not immersed in the etching liquid E), the etching liquid E is continuously circulated through the circulation pipe line 20A. Here, "the interval between the etching processes" corresponds to a time period from the pick-up (from the inner bath 11) of etched wafers W on completion of the Nth etching process to the time the next batch of wafers W to be etched is immersed into the inner bath 11 at the beginning of the Nth+1 time.

Due to the execution of the etching process, silicon (Si) from the wafers W dissolves into the etching liquid E in the inner bath 11, so that particles are produced. The particles contained in the etching liquid E, or the like are removed by the filter 23 in process of passing through the circulation pipe line 20A.

Meanwhile, when etching the wafers W in the boiling etching liquid E, etching at the desired etching rate requires that the concentration of phosphoric acid in the liquid E is adjusted within a designated range. The allowed extent of the designated range of the concentration of phosphoric acid is very narrow. However, since the etching liquid E is always boiling, the moisture in the etching liquid E gradually evaporates with the passing of time, so that the concentration of phosphoric acid in the liquid E rises.

Hereat, it should be noted that the boiling point of the etching liquid E ascends with the increasing of the concentration of phosphoric acid in the liquid E and descends with the decreasing of the same. Accordingly, if the boiling point of the liquid E rises with the increasing of the phosphoric acid concentration in the liquid E, then the temperature of the etching liquid E is also elevated up to the so-raised boiling point since the etching liquid E is subjected to a sufficient quantity of heat by the temperature controller 22. That means that the etching rate is increased, too.

Hereupon, when the etching liquid E is diluted with the pure water of a low temperature (any temperature will do so long as it is lower than the temperature of the liquid E), it is possible to lower the phosphoric acid concentration in the liquid E, thereby descending the boiling point of the etching liquid E. Additionally, the addition of pure water of the low temperature into etching liquid E would allow the temperature of the etching liquid E to lower up to the designated temperature immediately. Therefore, by diluting the etching liquid E with an appropriate amount of the pure water, it is possible to lower the temperature of the etching liquid E down to the designated temperature while maintaining the boiling condition of the etching liquid E. In other words, by maintaining the etching liquid E in the boiling condition at the designated temperature, it is possible to maintain the phosphoric acid concentration in the liquid E at a generally fixed value.

We now describe the control in both temperature and concentration of the etching liquid E, in detail. In operation, the CPU 70 does monitor the temperature of the etching liquid E in the inner bath 11 by means of the temperature sensor 80 thereby to always monitor the phosphoric acid concentration in the etching liquid E. When the detecting value by the temperature sensor 80 exceeds the designated range, the CPU 70 allows the valve 25 in the pure water pipe line 26 to open. Thus, the boiling point and temperature of the etching liquid E are so lowered that the concentration of the etching liquid E can be maintained to the designated value. However, if pure water is added continuously, then the concentration, boiling point and temperature of the etching liquid E would be lowered, so that the desired etching rate could not be accomplished. In order to prevent the above descents of the concentration, boiling point and temperature of the etching liquid E, the CPU 70 allows the valve 25 in the pure water pipe line 26 to close when the temperature detected by the temperature sensor 80 falls below the designated range. Owing to a repetition of the above-mentioned operations, it is possible to hold both etching temperature and concentration of the etching liquid E within the respective designated ranges.

It should be noted that when executing the etching process repeatedly, the Si concentration in the etching liquid E increases with the rising of concentration of both particles and oxides in the etching liquid E. However, cleaning of the etching liquid E through the filter 23 and dilution of the etching liquid E due to the pure water from the pure water source 24 alone, are not sufficient to restrict the rising of concentration of both particles and oxides in the etching liquid E. Note that, when the Si concentration reaches to too high, in other words, Si concentration reaches a value greater than a certain threshold value, the etching rate will fall short of the desired etching rate.

Now, we assume that the Si concentration detected by the concentration sensor 50 reaches a predetermined value, for example 100 PPM. In such as case, after the wafers W have been picked up on the completion of the etching process and before the next wafers to be processed are accommodated in the process bath 10, that is, within an interval between the present etching process and the next etching process, the CPU 70 carries out various operations as follows. Note, the predetermined value is determined equal to the threshold value or a little less than the threshold value.

At first, the CPU 70 operates to stop the circulation of the etching liquid E in the circulation system 20. For this operation, there may be provided an opening/closing valve being controlled by the CPU 70, which is disposed on the upstream side of a connection between the circulation pipe line 20A and the drain pipe line 31 and also disposed between the above connection and another connection of the circulation pipe line 20A with the pure water pipe line 26. Alternatively, by a command from the CPU 70, the operation of the pump 21 may be stopped.

Figure 3A:
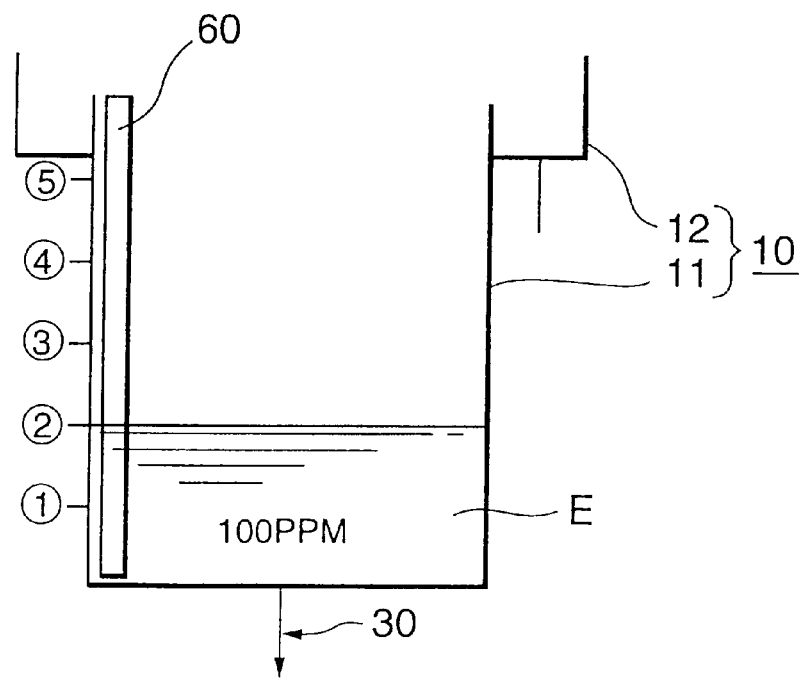
FIGS. 3A and 3B are schematic cross sectional views showing steps of exchanging the etching liquid, respectively.

Next, the CPU 70 outputs a control signal for opening the valve 32 in the drain system 30 thereby to discharge the etching liquid E in the inner bath 11 while leaving a part of the liquid E. The CPU 70 allows the valve 32 to close after a predetermined amount of the etching liquid E in the inner bath 11, for example about two thirds (2/3) of the totality stored in the inner bath 11 (see FIG. 3A), has been discharged.

Figure 3B:
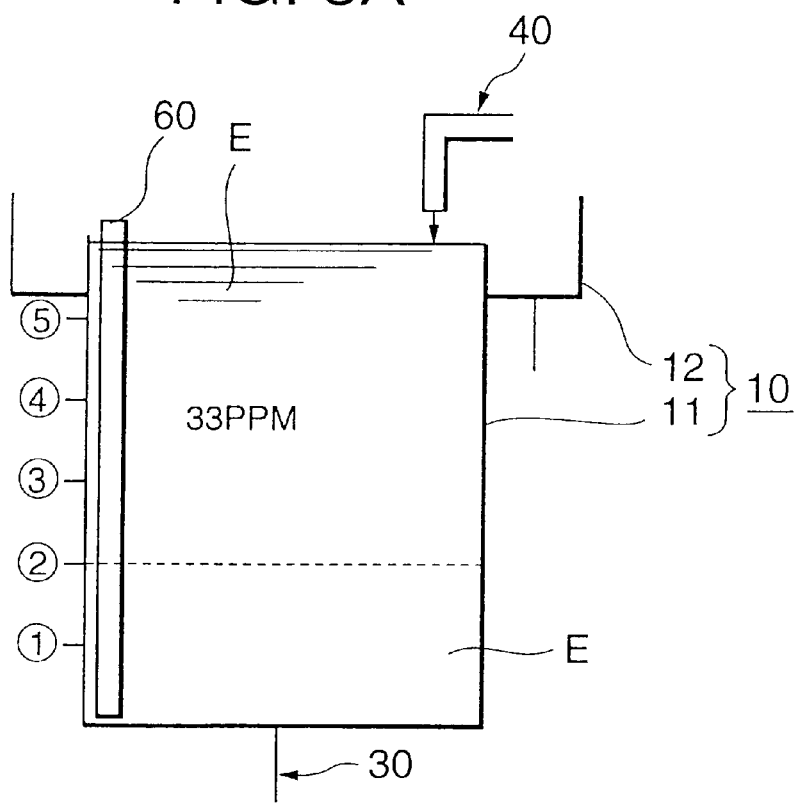

Next, the CPU 70 allows the valve 43 in the supply system 40 to open in a manner that the new etching liquid E of the same quantity as the amount of the liquid discharged in the above-mentioned process is supplied from the etching liquid reservoir 41 into the inner bath 11, for the supplement of the etching liquid E. That is, the new etching liquid is added into and mixed with the etching liquid E remaining in the inner bath 11. With the supplement, it is possible to control the Si concentration of the etching liquid E in the process bath 10 to an optional value, for example 33 PPM in the Si concentration, within a designated range where the etching rate of the oxide layer is not raised too much and the amount of particles in the etching liquid is not raised too much. (See FIG. 3B)

Under such a situation, the next wafers W are immersed into the etching liquid E for the subsequent etching treatment.

In this way, owing to the replacement of the etching liquid E not entirely but partially, it is possible to prevent the etching rate from rising excessively even after the liquid has been just exchanged. Thus, it is possible to control the etching degree of the oxide layer underlying the nitride layer in each wafer W in the designated range appropriately.

It should be noted that the etching rate exhibits the highest value just immediately after the exchange of the etching liquid and thereafter, the etching rate gradually decreases as the number of times for the etching process does increase. Therefore, in order to alter the controllable range of thickness of the underlying oxide layer, it has only to change the timing of exchanging the etching liquid properly.

In the above-mentioned embodiment, the partial replacement of the etching liquid E is carried out at a point of time when the Si concentration in the liquid E detected by the concentration sensor 50 reaches the predetermined value. However, of course, the timing of partial replacement of the etching liquid is not limited to the above embodiment but it may be made in accordance with the following steps (1), (2) or (3).

(1) For example, when it is determined to etch predetermined number of wafers w (e.g., fifty pieces of wafers W) in one etching process, in other words, in case that the number of wafers included in one process unit (i.e., the number of wafers to be processed in one etching process) is decided in advance, the partial replacement of the etching liquid E may be performed whenever the etching process of the designated number of times (e.g. fifteen times) has been completed. In this case, it would be carried out to obtain the number of times of etching process until the Si concentration in the etching liquid reaches the threshold value (or the Si concentration reaches a value a little less than the threshold value) by way of experiment and store the so-obtained number in the CPU 70. Whenever the designated number of etching process is completed, then the CPU 70 controls the operations of the valves 32, 43 to perform the partial replacement of the etching liquid E.

(2) Similarly to the above case (1), when it is determined to etch fifty pieces of wafers W in one etching process, the partial replacement of the etching liquid E may be performed whenever the process period in total reaches a predetermined time (e.g. one hour). Also in this case, it would be carried out to obtain a period of etching process necessary for the Si concentration in the etching liquid to reach the threshold value (or the Si concentration to reach a value a little less than the threshold value) by way of experiment and store the so-obtained period in the CPU 70. Then, the discharging and charging of the etching liquid would be carried out every predetermined time, as similar to the above case.

(3) Further, when the number of wafers W to be processed changes in a range from one to fifty pieces at every etching process, that is, in case that the number of wafers performing one etching process varies, the partial replacement of the etching liquid E may be performed whenever the total number of wafers being processed reaches a predetermined number (e.g. 700 pieces.). In this case, it would be carried out to obtain the total number of wafers until the Si concentration in the etching liquid reaches the threshold value (or the Si concentration to reach a value a little less than the threshold value) by way of experiment and store the so-obtained number in the CPU 70. Thus, the discharging and charging of the etching liquid would be carried out every predetermined number of the processed wafers, as similar to the above case. Note, in this case, it would be better to provide a sensor for detecting the number of wafers carried by the wafer boat on a wafer delivery unit for delivering the wafers to the wafer boat with and also allow the output from the sensor to be transmitted to the CPU 70.

In the above three cases (1)–(3), a counter means for counting number of times of the etching process, integrated period of the etching process or integrated number of the wafers may be provided. Preferably, the CPU 70 has the function of the counter means.

Also in cases of exchanging the etching liquid E in accordance with the above steps (1)–(3), it is possible to control the etching operation for the oxide layers on the wafers W, usually and properly.

In case of determing the timing for exchanging the etching liquid E in accordance with the above steps (1)–(3), a memory means is provided, in which a relationship between an integrated times of an etching process, an integrated times of the etching process or an integrated number of processed object and a concentration of the specified substance is stored. In this case, the concentration sensor 50 may be eliminated.

Note, regarding the exchange operations of etching liquid E in accordance with the above steps (1) to (3), (1) even before completing the etching process of the predetermined times; (2) even before reaching the predetermined period in total; and (3) even before reaching the predetermined number of wafers W, the partial exchange of the etching liquid E may be carried out at a point of time when the Si concentration in the liquid E detected by the concentration sensor 50 exceeds the second threshold value.

Although the supplement of new etching liquid E is equal to the quantity of the discharged etching liquid E in the above explanation, it is not always necessary to establish the former amount equal to the latter amount. Thus, in the modification, the supplement may be established corresponding to the temperature of the etching liquid E and the concentration of a specified substance in the liquid E, appropriately.

Furthermore, although it is preferable that the above "new etching liquid" supplied at the partial replacement in accordance with the present invention is an unused one, the invention is not limited to such a preferable embodiment. That is, the new etching liquid may be allocated by not only the "unused" etching liquid but an "used" etching liquid that, on completion of at least one etching process, the contents of the wafers dissolving in the liquid have been already eliminated to a degree affecting no influence against the etching process. Additionally, a mixture of the used etching liquid and the unused etching liquid may be used as the new etching liquid. That is, as the "new" etching liquid, the concentration of the specified substance (Si) contained therein has only to be at least lower than the concentration of the specified substance (Si) contained in the etching liquid existing in the inner bath 11 at the exchanging of the liquid.

EXAMPLE

With reference to the following example, the present invention will be described in more detail.

The following example is concerned with the etching process where the wafers W each having the silicon oxide layer (referred as "oxide layer", hereinafter) as an undercoating layer sand the silicon nitride layer (also referred as "nitride layer", hereinafter) are immersed into the phosphate solution ($H_3PO_4$).

Figure 4:
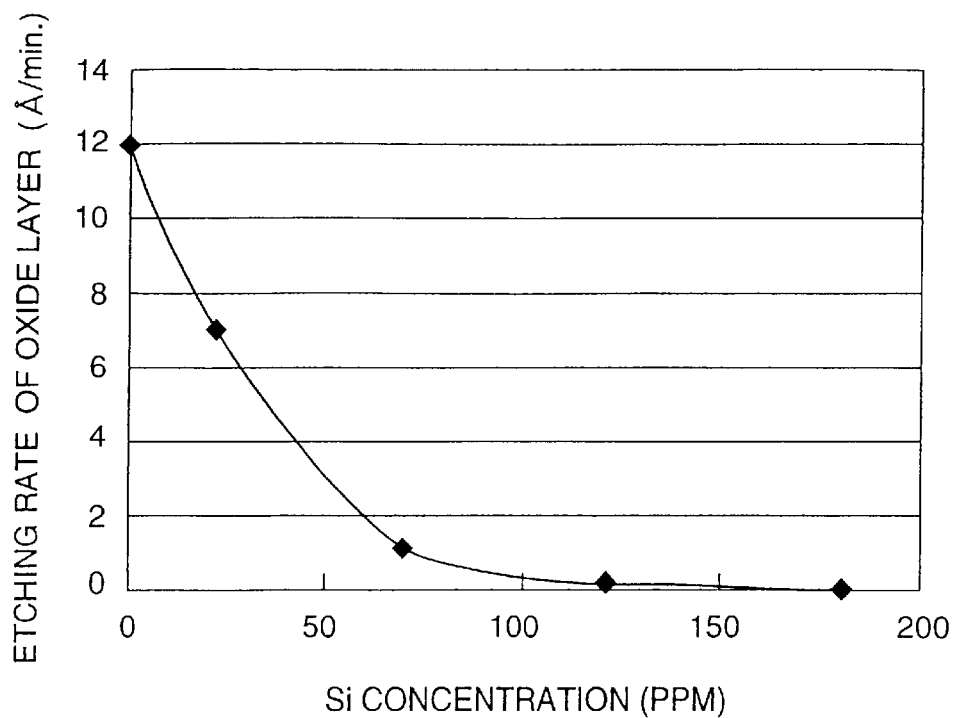
FIG. 4 is a graph showing a relationship between the Si concentration in the etching liquid and the etching rate for oxide layer.
Figure 5:
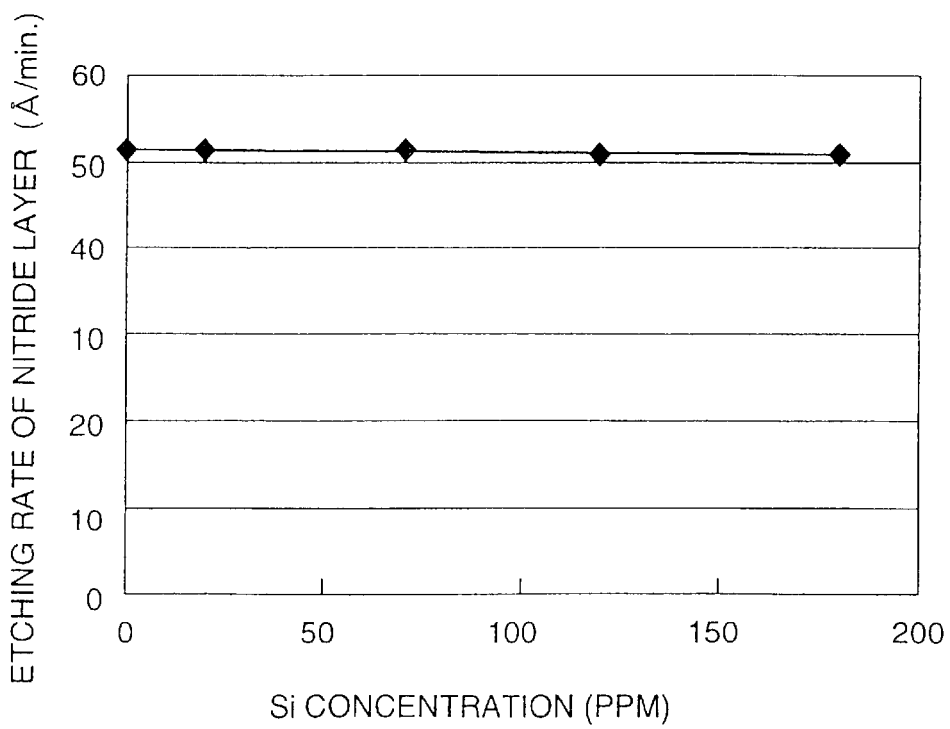
FIG. 5 is a graph showing a relationship between the Si concentration in the etching liquid and the etching rate for nitride layer.
Figure 6:
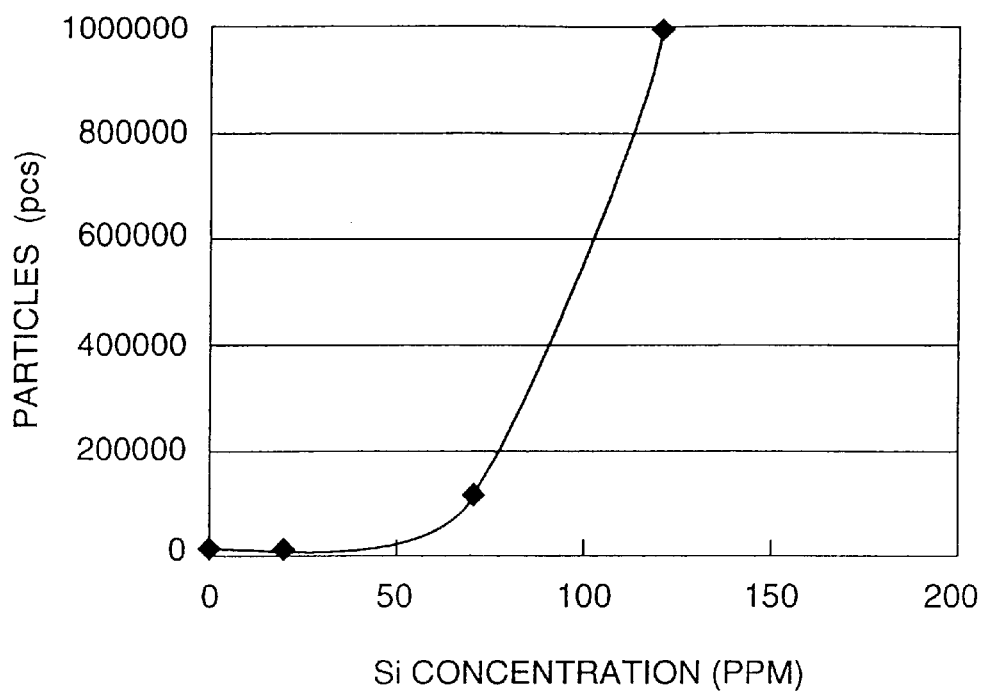
FIG. 6 is a graph showing a relationship between the Si concentration in the etching liquid and the amount of particles.

In general, respective relationships of silicon (Si) concentration in the etching liquid with the oxide layer's etching rate, the nitride layer's etching rate and the quantity of particles are shown in FIGS. 4, 5 and 6, respectively. Thus, from FIG. 4, it will be understood that the lower the Si concentration becomes, the higher the oxide layer etching rate is raised and therefore, the oxide layer's etching rate points out 12 to 3 (Å/min.) in the range of 0 to 50 PPM in the Si concentration. On the contrary, the nitride layer's etching rate is stable at approx. 50 (Å/min.) irrespective of the Si concentration, as shown in FIG. 5. Further, as shown in FIG. 6, it is found that the quantity of particles in the etching liquid radically increases when the Si concentration becomes larger than 50 PPM. In detail, the number of particles is 100000 to 1000000 (pcs.) in the range of Si concentration from the vicinity of 60 PPM to the vicinity of 100 PPM.

We investigated a thickness of the oxide layer (residual layer thickness) in case of etching the wafers W each having the oxide layer as the undercoating layer and the nitride layer laminated thereon by using the phosphate solution ($H_3PO_4$) of 150° C. Note, the target thickness of residual oxide layer was from 240 Å to 250Å.

Figure 7:
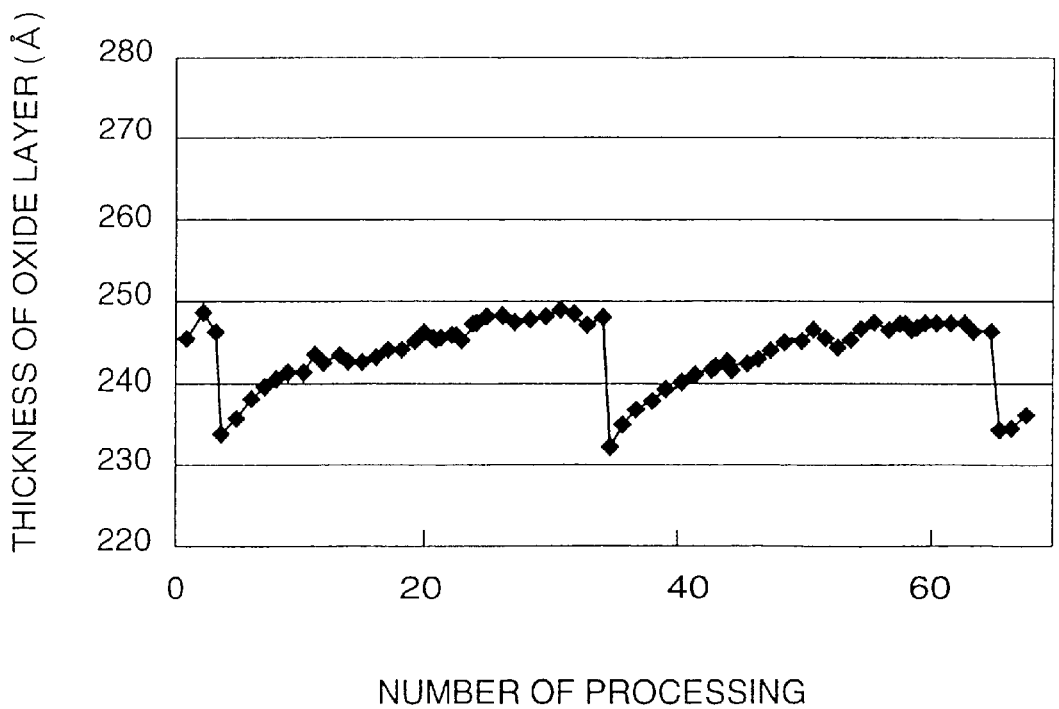
FIG. 7 is a graph showing a relationship between the number of treatments for wafers and the thickness of oxide layer in case of exchanging the whole quantity of etching liquid every thirty times of etching.
Figure 8:
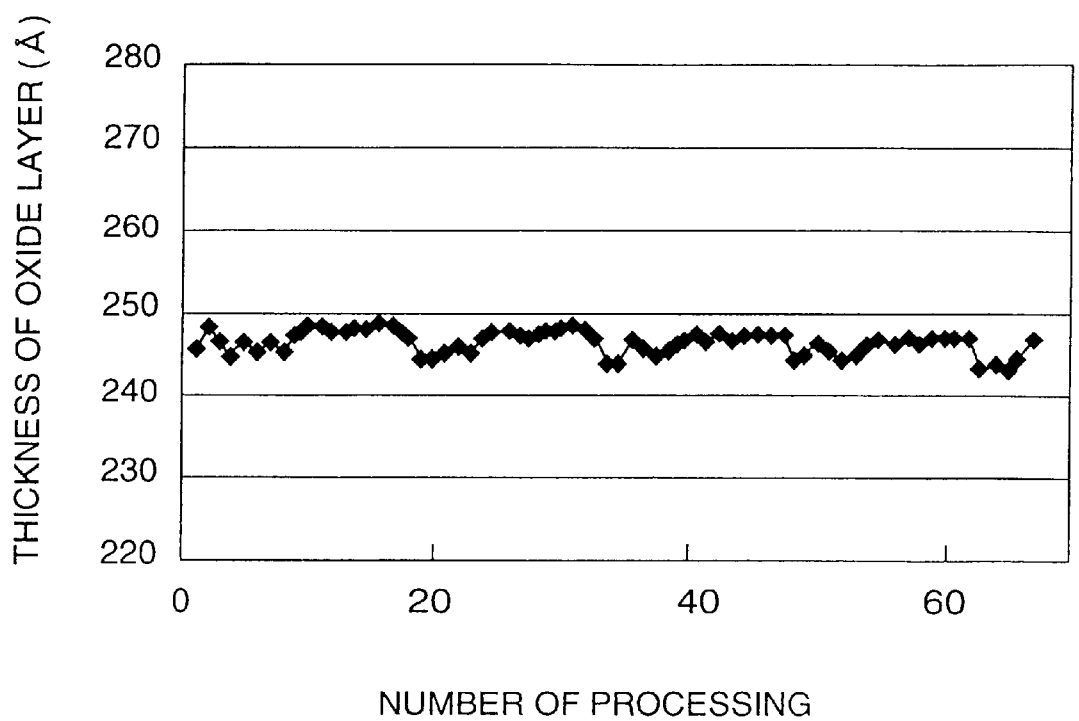
FIG. 8 is a graph showing a relationship between the number of treatments for wafers and the thickness of oxide layer in case of exchanging a portion of the etching liquid every fifteen times of etching, in accordance with the present invention.
Figure 9A:
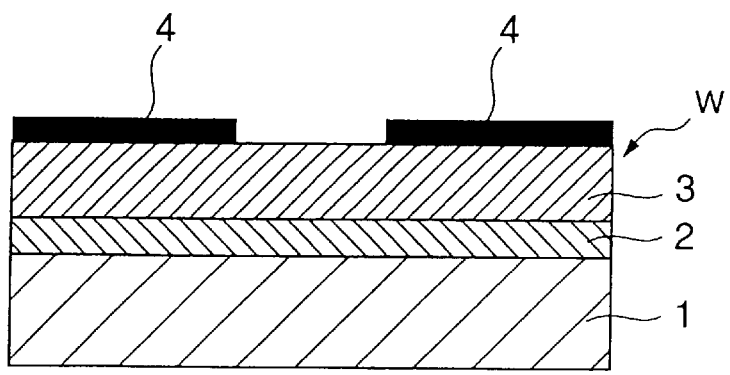
FIG. 9A is a cross sectional view showing a state before etching a semiconductor wafer having an oxide layer as an undercoat and a nitride layer thereon.
Figure 9B:
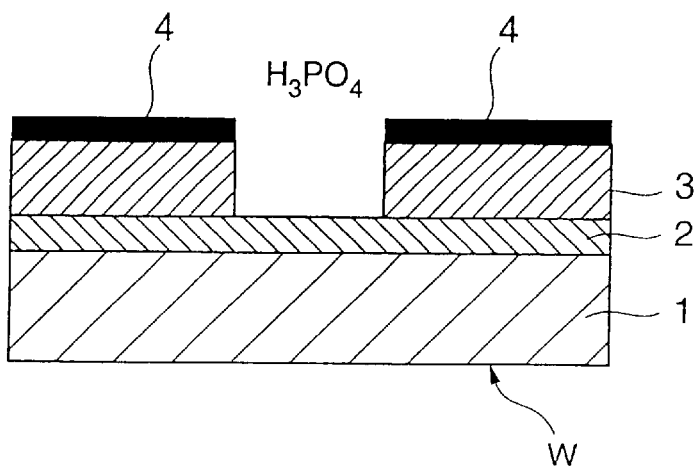
FIG. 9B is a cross sectional view showing a state after etching the wafer of FIG. 9A by the phosphate solution.
Figure 10:
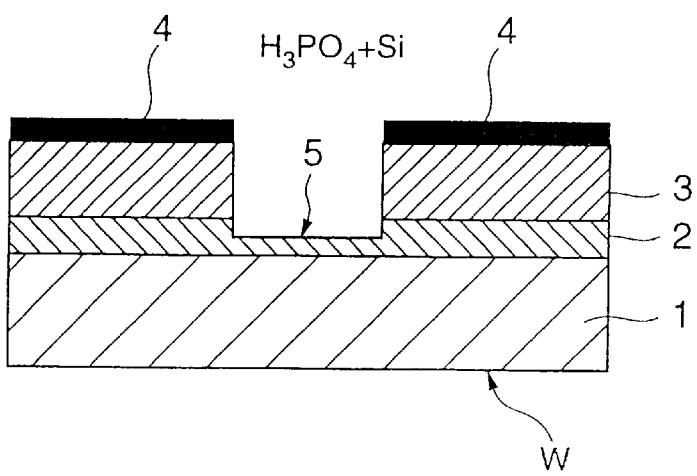
FIG. 10 is a cross sectional view showing a condition that the wafer of FIG. 9A has been etched excessively.

According to the investigation result, it was found that in case of exchanging all of the etching liquid every thirty times of process, the residual layer thickness as the result of etching held immediately after the exchange is approx. 230 Å and the oxide layer is subjected to over-etching (see FIG. 7). From an exchange of the etching liquid till the sequent etching of ten times, the oxide layer was over-etched to the target thickness and therefore, the appropriate etching was not performed. The reason is that the oxide layer is eliminated too much since the Si concentration is low just after the exchange of etching liquid.

On the contrary, it was confirmed that, when the etching was performed while exchanging one third (⅓) of the whole etching liquid with every fifteen times of etching in accordance with the present invention, the residual oxide layer of 240 to 250 Å could be attained just after the exchange of etching liquid.

What is claimed is:

1. An etching method comprising the steps of:
   (a) etching at least one object by immersing the object in an etching liquid stored in a process bath;
   (b) partially draining the etching liquid used in the etching step (a) from the process bath while leaving an amount of the etching liquid in the process bath;
   (c) supplying a new etching liquid into the process bath, thereby making a mixture of the new etching liquid and the used etching liquid left in the process bath; and
   (d) etching an at least one object other than the objects etched in the etching step (a) by immersing it in the mixture stored in a process bath.

2. The etching method as claimed in claim 1, wherein the draining step and the supplying step are carried out while the etching step (a) is not executed.

3. The etching method as claimed in claim 1, wherein the supplying step is carried out after completing the draining step.

4. The etching method as claimed in claim 1, wherein the draining step and the supplying step are carried out after completing the etching step (a) a number of times.

5. The etching method as claimed in claim 1, wherein the draining step and the supplying step are carried out after an integrated period of the etching step (a) has reached a period.

6. The etching method as claimed in claim 1, wherein the draining step and the supplying step are carried out after an integrated number of the objects has reach a number.

7. The etching method as claimed in claim 1, further comprising the step of:
   detecting a concentration of a specified substance contained in the etching liquid which has been used in the etching step,
   wherein the draining step and the supplying step are carried out after the concentration of the specified substance has reached a predetermined value.

8. The etching method as claimed in claimed 1, wherein an amount of the new etching liquid supplied to the process bath at the supplying step (c) is substantially equal to an amount the etching liquid drained from the process at the draining step (b).

9. The etching method as claimed in claim 1, wherein the draining step and the supplying step are carried out for the purpose of controlling an amount of etching of the object by adjusting the concentration of a specified substance contained in the etching liquid.

10. The etching method as claimed in claim 9, wherein the specified substance contained in the etching liquid is a substance dissolving from the object into the etching liquid.

11. The etching method as claimed in claim 10, wherein the object to be processed is a substrate having a silicon oxide layer formed thereon and a silicon nitride layer laminated on the silicon oxide layer, and wherein the etching liquid is a phosphate solution.

12. The etching method as claimed in claim 1, further comprising the step of:

circulating the etching liquid, the circulating step including the steps of:

causing the etching liquid to overflow the process bath;
controlling the nature of the etching liquid overflowing the process bath; and
returning the so-controlled etching liquid to the process bath.

13. The etching method as claimed in claim 12, wherein the controlling step in the circulating step contains a step of diluting the etching liquid.

14. The etching method as claimed in claim 12, wherein the etching method is a method for etching the object in the etching liquid in a boiling condition, wherein the controlling step in the circulating step is carried out for the purpose of controlling an boiling point of the etching liquid.

15. The etching method as claimed in claim 12, wherein the controlling step in the circulating step further includes a step of heating the etching liquid and a step of removing particles in the etching liquid.

* * * * *